United States Patent
Mayes

(10) Patent No.: US 6,639,526 B1
(45) Date of Patent: Oct. 28, 2003

(54) CIRCUITS AND METHODS FOR A VARIABLE OVERSAMPLE RATIO DELTA-SIGMA ANALOG-TO-DIGITAL CONVERTER

(75) Inventor: Michael Keith Mayes, Campbell, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 10/104,808

(22) Filed: Mar. 21, 2002

(51) Int. Cl.[7] .......................... H03M 7/00; H03M 3/00; H03M 1/12
(52) U.S. Cl. .......................... 341/61; 341/143; 341/155
(58) Field of Search .......................... 341/61, 143, 77, 341/120, 131, 155

(56) References Cited

U.S. PATENT DOCUMENTS

| | | | | |
|---|---|---|---|---|
| 4,943,807 A | * | 7/1990 | Early et al. | 341/120 |
| 4,972,436 A | * | 11/1990 | Halim et al. | 375/247 |
| 5,144,308 A | * | 9/1992 | Norsworthy | 341/131 |
| 5,187,482 A | * | 2/1993 | Tiemann et al. | 341/143 |
| 5,757,299 A | * | 5/1998 | Noro et al. | 341/143 |
| 6,124,815 A | * | 9/2000 | Lee et al. | 341/143 |
| 6,140,950 A | | 10/2000 | Oprescu | 341/143 |
| 6,169,506 B1 | | 1/2001 | Oprescu et al. | 341/143 |
| 6,208,279 B1 | | 3/2001 | Oprescu | 341/143 |
| 6,285,306 B1 | * | 9/2001 | Zrilic | 341/143 |
| 6,337,645 B1 | * | 1/2002 | Pflaumer | 341/143 |

OTHER PUBLICATIONS

M. P. Donadio, "CIC Filter Introduction," downloaded from the Internet at http://www.dspguru.com/info/tutor/cic.htm, Jul. 18, 2000.

"Cascaded Integrator–Comb (CIC) Filter v. 1.0," Product Specification, LogiCore, Xilinx, Inc., Mar. 2, 2001.

G. Noriega, "Sigma–Delta A/D Converters—Audio and Medium Bandwidths," Technical Notes—DT3, RMS Instruments, downloaded from the Internet at http://www.rmsinst.com/dt3.htm, Feb. 1996.

"An Overview of Data Converters," Application Note AN100, Philips Semiconductors, Dec. 1991.

S. Park, "Principles of Sigma–Delta Modulation for Analog-to–Digital Converters," Communications Applications Manual, APR8, Motorola, DL411D/REV 1, 1993.

E. Dijkstra, et al., "On the Use of Modulo Arithmetic Comb Filters in Sigma Delta Modulators," IEEE Proc. ICASSP, pp. 2001–2004, Apr. 1988.

B. E. Boser, et al., "The Design of Sigma–Delta Modulation Analog–to–Digital Converters," IEEE Journal of Solid State Circuits, vol. 23, pp. 1298–1303, Dec. 1988.

J. C. Candy, "Decimation for Sigma Delta Modulation," IEEE Transactions on Communications, vol. COM–34, pp. 72–76, Jan. 1986.

J. C. Candy, et al., "Oversampling Delta–Sigma Data Converters—Theory, Design, and Simulation," IEEE Press, NY, pp. 1–25, 1992.

(List continued on next page.)

Primary Examiner—Jean Bruner Jeanglaude
(74) Attorney, Agent, or Firm—Fish & Neave

(57) ABSTRACT

Circuits and methods for a delta-sigma analog-to-digital converter having a variable oversample ratio to produce a constant fullscale output at reduced circuit complexity, die area, and power dissipation are provided. The circuits and methods consist of scaling the digital input to the digital filter with a decoder whose size depends on the number of oversample ratios allowed by the analog-to-digital converter. The digital filter is implemented as a comb filter having a cascade of N integrators and N differentiators, where N is the order of the digital filter. The size of the differentiators is equal to the number of bits used as output for the analog-to-digital converter, which is smaller than the size of the integrators and the number of bits produced by the digital filter.

37 Claims, 5 Drawing Sheets

OTHER PUBLICATIONS

"ADC0820: 8–Bit High Speed µP Compatible A/D Converter With Track/Hold Function," datasheet, National Semiconductor, Jun. 1999.

"LTC1410: 12–Bit, 1.25 Msps Sampling A/D Converter with Shutdown," datasheet, Linear Technology, 1995.

ADC0801/ADC0802/ADC0803/ADC0804/ADC0805: 8–Bit µP Compatible A/D Converters, datasheet, National Semiconductor, Nov. 1999.

"AD650: Voltage–to–Frequency and Frequency–to–Voltage Converter," datasheet, Analog Devices, 2000.

"LM231A/LM231/LM331A/LM331: Precision Voltage–to–Frequency Converters," datasheet, National Semiconductor, Jun. 1999.

"ALD500AU/ALD500A/ALD500: Precision Integrating Analog Processor," datasheet, Advanced Linear Devices, Inc., 1999.

"AD1170: High Resolution, Programmable Integrating A/D Converter," datasheet, Rev. A, Analog Devices, Aug. 1999.

"LTC2400: 24–Bit µPower No Latency ΔΣ™ ADC in SO–8," datasheet, Linear Technology, 1998.

"LTC2410: 24–Bit No Latency ΔΣ™ ADC with Differential Input and Differential Reference," datasheet, Linear Technology, 2000.

* cited by examiner

CIRCUITS AND METHODS FOR A VARIABLE OVERSAMPLE RATIO DELTA-SIGMA ANALOG-TO-DIGITAL CONVERTER

FIELD OF THE INVENTION

This invention relates generally to delta-sigma analog-to-digital converters. More specifically, the present invention provides circuits and methods for a delta-sigma analog-to-digital converter having a variable oversample ratio produce a constant fullscale output with reduced circuit complexity, die area, and power dissipation.

BACKGROUND OF THE INVENTION

Analog-to-digital converters ("ADC") are electronic devices that convert analog signals into digital representations. As such, they form an integral part of any digital system requiring an interface between external analog signals and the digital circuits in the system.

A block diagram of an ADC is shown in FIG. 1. ADC 20 uses reference voltage $V_{ref}$ to convert analog signal $V_{in}$ into N-bit digital signal $D_{out}$. Analog signal $V_{in}$ is first sampled into a discrete-time signal and then the discrete-time signal is quantized into a finite number of quantization levels to produce $D_{out}$. For an N-bit $D_{out}$, $V_{in}$ is quantized into $2^N$ levels, with each level separated by a quantization step size. As a result of the quantization, a number of input voltage signal levels produces identical digital outputs.

Reference voltage $V_{ref}$ provides the range of conversion for the ADC so that input signal $V_{in}$ may range from 0 to $+V_{ref}$ or from $-V_{ref}$ to $+V_{ref}$ (for a bipolar ADC) If $V_{in}$ is equal to or larger than $V_{ref}$, commonly referred to as the fullscale input, $D_{out}$ outputs all ones and is referred to as the fullscale output. If $V_{in}$ is equal to or smaller than $0/-V_{ref}$ V, $D_{out}$ outputs all zeros. For $V_{in}$ between these two voltage levels, $D_{out}$ is a binary number corresponding to the $V_{in}$ signal level such that a change in $V_{in}$ of a quantization step size of $V_{ref}/2^N$ corresponds to a 1-bit change in the least significant bit ("LSB") of The performance of an ADC is evaluated based on its resolution, accuracy, and speed. The resolution of an ADC is determined by the number of bits used to represent $D_{out}$. An N-bit ADC has a resolution of 1:2N. The accuracy of the conversion is represented in terms of the quantization step size/bit or in terms of the RMS noise generated for a fixed input. The speed or conversion rate of the ADC is the time it takes for the ADC to perform a conversion. The higher the number of times an input is sampled per conversion result, the higher the resolution and accuracy of the conversion and the slower the speed of the ADC. For example, an 8-bit ADC having a $V_{ref}$ of 5 V quantizes the input voltage into 256 levels with a quantization step size of 19.5 mV. That is, the ADC cannot resolve input voltage differences smaller than 19.5 mV, i.e., this 8-bit ADC has an accuracy of 19.5 mV/bit. In contrast, a 12-bit ADC with 4096 quantization levels can resolve voltage differences as small as 1.2 mV, i.e., its accuracy is 1.2 mV/bit.

The trade-off between resolution, accuracy, and speed of an ADC is highly dependent on its architecture. There are many different architectures of ADCs available, with the most popular ones being the parallel or flash converter, the successive approximation ADC, the voltage-to-frequency ADC, the integrating ADC, and the delta-sigma or sigma-delta ADC. The parallel converter is the simplest and fastest ADC, with the N output bits determined in parallel by $2^N-1$ comparators. However, because this architecture requires a large number of comparators, commercial parallel ADCs have very limited resolution, up to 1:1024 (10-bit outputs). Examples of commercially available parallel ADCs include the 8-bit ADC0820, sold by National Semiconductor, of Santa Clara, Calif., and the 8-bit AD7820, sold by Analog Devices, Inc., of Northwood, Mass.

Successive approximation ADCs are also relatively fast, employing a digital-to-analog converter ("DAC") to try out various digital output levels and a single comparator to compare the result of the DAC conversion to the analog input voltage. For a N-bit successive approximation ADC, N comparisons are required. Successive approximation ADCs are inexpensive to implement and commercial implementations typically range from 8 to 16 bits. Examples of commercially available successive approximation ADCs include the 12-bit LTC1410, sold by Linear Technology Corp., of Milpitas, Calif., and the 8-bit ADC0801, sold by National Semiconductor, of Santa Clara, Calif.

If speed is not important, voltage-to-frequency ADCs offer an inexpensive architecture suitable for converting slow and often noisy signals. These ADCs convert an input voltage into an output pulse train whose frequency is proportional to the input voltage. The output frequency is determined by counting pulses over a fixed time interval. Commercially available voltage-to-frequency ADCs have outputs ranging from 8 to 12 bits and are useful for applications in noisy environments when an output frequency is desired, such as in remote sensing applications when an analog input voltage is converted to an output pulse train at a remote location and the output pulse train is transmitted over a long distance to eliminate the noise introduced in the transmission of an analog signal. Examples of voltage-to-frequency ADCs include the AD650, sold by Analog Devices, Inc., of Northwood, Mass., and the LM331, sold by National Semiconductor, of Santa Clara, Calif.

For low speed applications requiring higher resolution, integrating ADCs provide a better alternative to voltage-to-frequency ADCs. Integrating ADCs measure the charge and discharge times of a capacitor to determine the digital output according to the relationship between the input voltage and the capacitor charge and discharge times. In single-slope integrating ADCs, the relationship is determined by counting clock pulses until a comparator finds the capacitor charged to the input voltage. The digital output is given by the number of clock pulses. In dual-slope integrating ADCs, the relationship is determined by charging the capacitor for a fixed time period with a current that is proportional to the input voltage and subsequently discharging the capacitor with a constant current. The time to discharge the capacitor is proportional to the input voltage and the digital output is given by the number of clock pulses counted while the capacitor is discharging. Single-slope integrating ADCs are simple to implement but not as accurate as dual-slope integrating ADCs, which are commonly used in high precision digital systems. The resolution of commercially available integrating ADCs may range from $1:2^{10}$ to $1:2^{20}$. Examples include the 18-bit ALD500, sold by Advanced Linear Devices, Inc., of Sunnyvale, Calif., and the 18-bit AD1170, sold by Analog Devices, Inc., of Northwood, Mass.

Although the ADC architectures discussed above provide a wide range of choices in terms of resolution, accuracy, and speed, their analog components make it difficult to integrate their circuitry in high-speed VLSI technology. Because they operate at a relatively low sampling frequency, usually at the Nyquist rate of the input signal, they often require an external anti-aliasing analog filter and sample-and-hold circuitry to limit the frequency of the input signal. Additionally, these ADC architectures are vulnerable to noise and interference and require high-accuracy analog components in order to achieve high resolution.

Currently available delta-sigma ADCs provide a solution to the VLSI integration and noise problems of the previous ADC architectures. Delta-sigma ADCs use a low resolution (e.g., 1-bit) delta-sigma analog modulator running at very high sampling rates combined with a digital filter to achieve high output resolutions. The modulator oversamples the input signal, transforming it into a serial bit stream at a frequency well above the output rate. The digital filter then low-pass filters and decimates the bit stream generated by the modulator to achieve an improved resolution at a lower output rate. For example, a 20-bit delta-sigma ADC may be implemented by combining a 1-bit delta-sigma modulator sampling an input multiple times and applying the result to a digital filter. Since a 1-bit delta-sigma modulator does not require special analog circuit processes, the delta-sigma ADCs can be easily implemented into VLSI technology and integrated into complex monolithic systems that incorporate both analog and digital components. The implementation cost is low and will continue to decrease with further advances in VLSI technology.

Additionally, as a result of the higher input sampling rate, delta-sigma ADCs require a much simpler anti-aliasing analog filter than traditional ADCs and no external sample-and-hold circuitry. The digital filter can be tailored to minimize the noise as desired. Commercially available delta-sigma ADCs also achieve higher resolutions than the other ADC architectures discussed above, with the resolutions typically ranging from $1:2^{16}$ to $1:2^{24}$. Delta-sigma ADCs are increasingly replacing voltage-to-frequency and integrating ADCs as the preferred architecture in many applications. Examples of delta-sigma ADCs include the 24-bit LTC2400 and the 24-bit LTC2410, sold by Linear Technology Corp., of Milpitas, Calif.

A block diagram of a delta-sigma ADC is shown in FIG. 2. Delta-sigma ADC 25 consists of two components: oversampled analog delta-sigma modulator 30 and low-pass digital filter 35. Oversampled analog modulator 30 samples the input signal at a sampling rate $F_{sample}$ that is much higher than the Nyquist frequency to produce a B-bit stream of data. As a result, the quantization noise is high-pass noise shaped over a bandwidth equal to $F_{sample}$ so that most of the energy of the quantization noise is above the bandwidth of the input signal. The quantization noise is then filtered out by low-pass digital filter 35, which also performs a decimation step to produce a M-bit digital output, with M>>B, at a sampling rate of $F_{out}<<F_{sample}$. The ratio between oversampled analog modulator 30 sampling rate $F_{sample}$ and the sampling rate $F_{out}$, which is ADC 25's conversion rate, is referred to as the oversample ratio ("OSR"), that is, OSR= $F_{sample}/F_{out}$.

The oversample ratio represents the number of times the input signal is sampled for each analog-to-digital conversion. As OSR increases, the number of times the input signal is sampled increases, thereby decreasing the passband noise output by modulator 30. The reduction in noise at the lower frequencies combined with digital filter 35 increases the resolution of ADC 25. Increasing OSR for a given sampling rate $F_{sample}$ also decreases $F_{out}$, i.e., the speed of ADC 25 decreases. That is, OSR offers a trade-off between speed and resolution.

To achieve the different resolution and accuracy requirements of a wide range of applications, multiple ADCs running at different speeds and resolutions may be used. Preferably, a single ADC may be used if it is designed to handle a variable OSR. Having a variable OSR in a delta-sigma ADC implies that the size of the digital filter of a given filter order is determined by the maximum allowed OSR. Such an ADC can run at different resolutions and speeds but requires further digital processing to produce conversion results that are independent of OSR. For example, an M-bit digital filter will only be able to produce a fullscale digital output for a fullscale input when the OSR is at its maximum. If the OSR is reduced such that the ADC's resolution is reduced from $1:2^M$ to $1:2^J$, where J<M, the M-bit output will only have J ones and the top M−J bits will be equal to zero and unused. This implies that the conventional delta-sigma ADC architecture shown in FIG. 2 is not ideally suited to handle a variable OSR as it wastes die area, circuitry complexity, and power to generate unused bits when the OSR is lower than the maximum allowed OSR.

In view of the foregoing, it would be desirable to provide circuits and methods for a delta-sigma analog-to-digital converter to handle a variable oversample ratio that provides various resolutions and conversion rates.

It further would be desirable to provide circuits and methods for a delta-sigma analog-to-digital converter to offer various resolutions and conversion rates with reduced design complexity, die area, and power dissipation.

It also would be desirable to provide circuits and methods for a delta-sigma analog-to-digital converter to produce a constant fullscale output independent of its oversample ratio.

SUMMARY OF THE INVENTION

In view of the foregoing, it is an object of the present invention to provide circuits and methods for a delta-sigma analog-to-digital converter to handle a variable oversample ratio that provides various resolutions and conversion rates.

It is a further object of the present invention to provide circuits and methods for a delta-sigma analog-to-digital converter to offer various resolutions and conversion rates with reduced design complexity, die area, and power dissipation.

It is also an object of the present invention to provide circuits and methods for a delta-sigma analog-to-digital converter to produce a constant fullscale output independent of its oversample ratio.

These and other objects of the present invention are accomplished by providing circuits and methods for a delta-sigma analog-to-digital converter having a variable oversample ratio to produce a constant fullscale output at reduced circuit complexity, die area, and power dissipation.

The circuits and methods of the present invention consist of implementing the digital filter in the delta-sigma converter as a comb filter and scaling the input to the comb filter. In a preferred embodiment, a decoder is used-to scale the input to the comb filter. The decoder adjusts the B-bit output provided by the oversampled analog modulator according to its OSR so that the fullscale output of the digital filter is independent of the OSR. Consequently, there are no wasted bits and the lower bits output by the digital filter are always zero. Since the filter size is much larger than the required resolution, the lower bits may be removed, that is, the hardware required to output the lower bits need not be implemented.

The comb filter is implemented in hardware as a cascade of integrators and differentiators and the decoder is implemented as a 1:J decoder, where J is the number of OSRs allowed by the delta-sigma converter.

Advantageously, the present invention enables the delta-sigma converter to produce a constant fullscale output independent of the OSR. The present invention also reduces circuitry complexity, die area, and power dissipation of a delta-sigma converter when compared to other previously-known delta-sigma converters that produce a constant fullscale output independent of the OSR.

BRIEF DESCRIPTION OF THE DRAWINGS

The foregoing and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
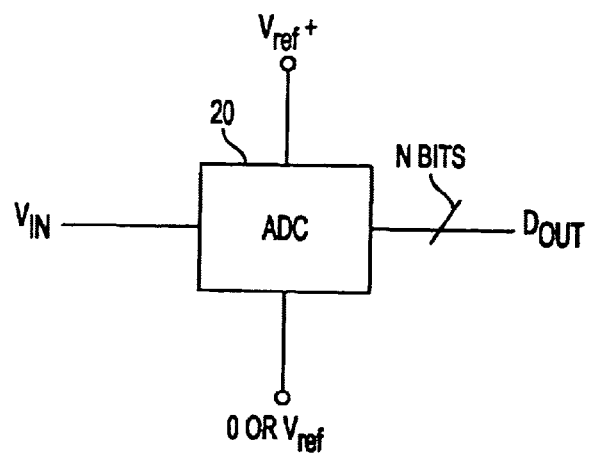
FIG. 1 is a block diagram of a prior art analog-to-digital converter.
Figure 2:
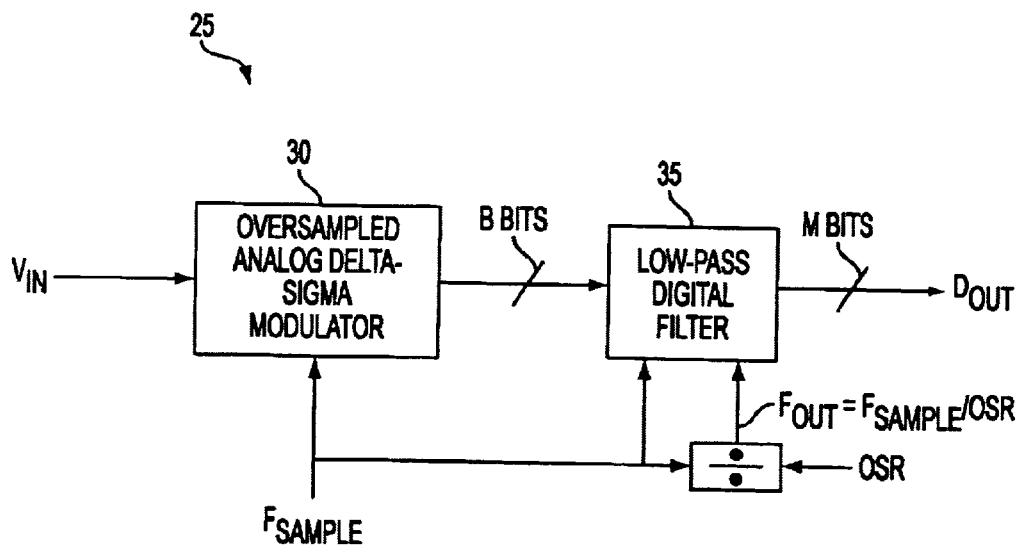
FIG. 2 is a block diagram of a prior art delta-sigma analog-to-digital converter.
Figure 3:
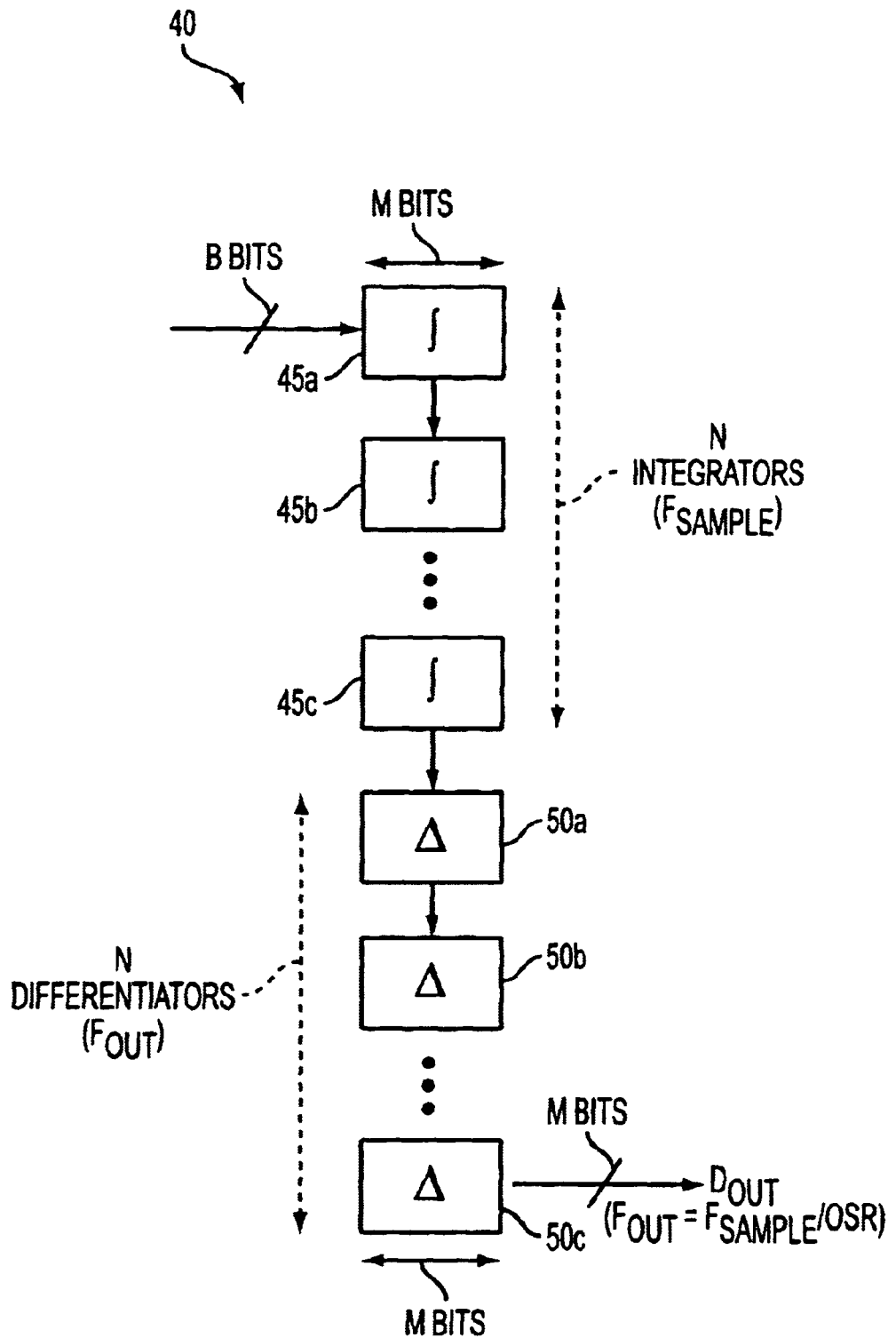
FIG. 3 is a block diagram of a prior art implementation of a $N^{th}$ order comb filter as a cascade of N integrators and N differentiators.

Referring to FIG. 3, a block diagram of a prior art implementation of a $N^{th}$ order comb filter as a cascade of N integrators and N differentiators is described. Digital filter 40 is a "sinc" or "comb" filter commonly used in delta-sigma analog-to-digital converters. The comb filter is easy to implement and preserves the spectral shape of the noise introduced by analog modulator 30 so that most of the noise at the high frequencies is discarded and the digital signal is decimated with a negligible loss of signal-to-noise ratio.

The frequency response H(f) of digital filter 40 is given in Equation (1), where f is the frequency of the input signal generated by analog modulator 30 and N is the order of digital filter 40.

$$H(f) = \left(\frac{\sin(f)}{f}\right)^N \qquad \text{Equation (1)}$$

The z-transform of H(f) is given in Equation (2), where $z=e^{j2\pi fT}$ and T is the period of the input signal (or spacing between the input samples).

$$H(z) = \left(\frac{1-z^{-OSR}}{1-z^{-1}}\right)^N \qquad \text{Equation (2)}$$

H(z) can be represented in two factors as:

$$H(z) = \left(\frac{1}{1-z^{-1}}\right)^N (1-z^{-OSR})^N \qquad \text{Equation (3)}$$

The first factor of H(z), $(1/1-z^{-1})^N$, is a polynomial of the form:

$$\left(\frac{1}{1-z^{-1}}\right)^N = (1+z^{-1}+z^{-2}+\ldots)^N, \quad z<1 \qquad \text{Equation (4)}$$

This polynomial represents the transfer function of a cascade of N integrators, shown in FIG. 3 by integrators 45a–c. The N integrators run at the input sampling rate $F_{sample}$.

The second factor of H(z), $(1-z^{-OSR})^N$, represents the transfer function of a cascade of N differentiators, shown in FIG. 3 by differentiators 50a–c. The N differentiators subtract the previous sample ($z^{-OSR}$) from the present sample (1) and run at the output sampling rate $F_{out}$ for decimation of the input signal by a factor of OSR.

Figure 4A:
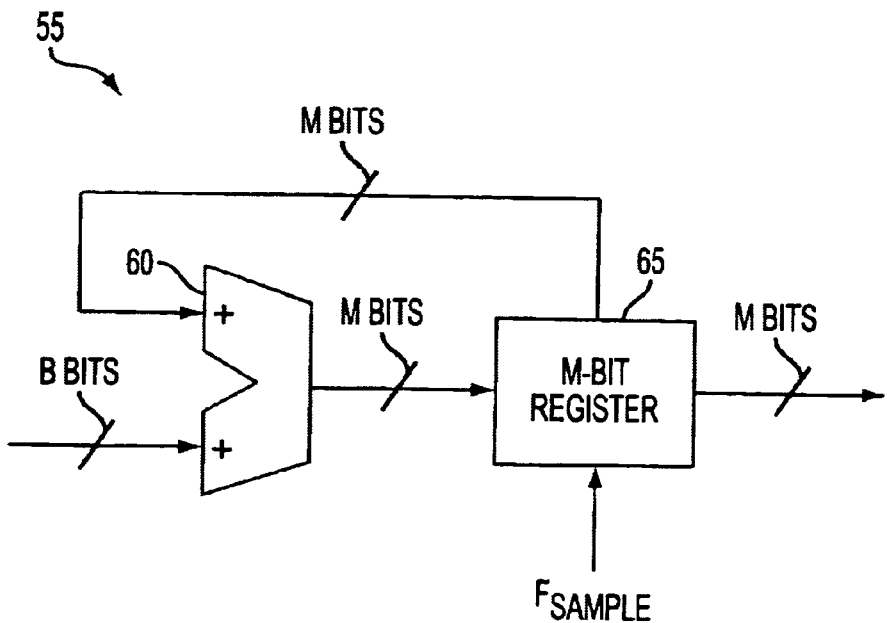
FIG. 4A is a block diagram of a prior art implementation of an integrator for use in a comb filter in a delta-sigma analog-to-digital converter.

Referring now to FIG. 4A, a block diagram of a prior art implementation of an integrator for use in a comb filter in a delta-sigma analog-to-digital converter is described. Integrator 55 is implemented in hardware by adder 60 and M-bit register 65. Adder 60 takes the B bits provided by analog modulator 30 and adds them to the M-bits generated by register 65 at the input sampling rate $F_{sample}$.

Figure 4B:
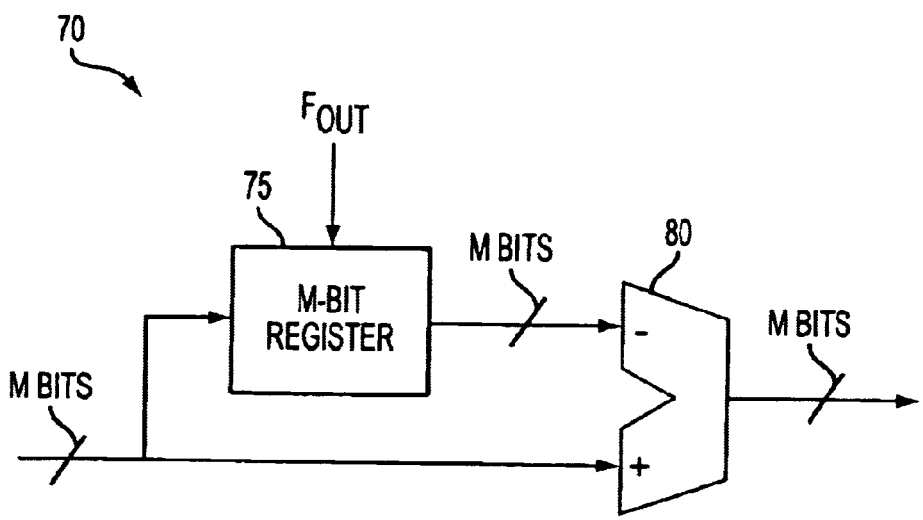
FIG. 4B is a block diagram of a prior art implementation of a differentiator for use in a comb filter in a delta-sigma analog-to-digital converter.

Referring now to FIG. 4B, a block diagram of a prior art implementation of a differentiator for use in a comb filter in a delta-sigma analog-to-digital converter is described. Differentiator 70 is also implemented in hardware by an adder (adder 75) and an M-bit register (register 80). Adder 75 subtracts the M-bit sample at sampling rate $F_{out}$ from the M-bit sample provided by the previous stage, which can either be the previous differentiator or the last integrator from the cascade of N integrators (FIG. 3) in case differentiator 70 represents the first differentiator in the cascade of N differentiators. The first differentiator also performs a decimation of the sampling rate from $F_{sample}$ to $F_{out}$.

For both integrator 55 and differentiator 70, the number of output bits M is a function of OSR, filter order N, and input bits B as given in Equation (5).

$$M = \frac{N \cdot \log(OSR \cdot B)}{\log(2)} \qquad \text{Equation (5)}$$

Figure 5:
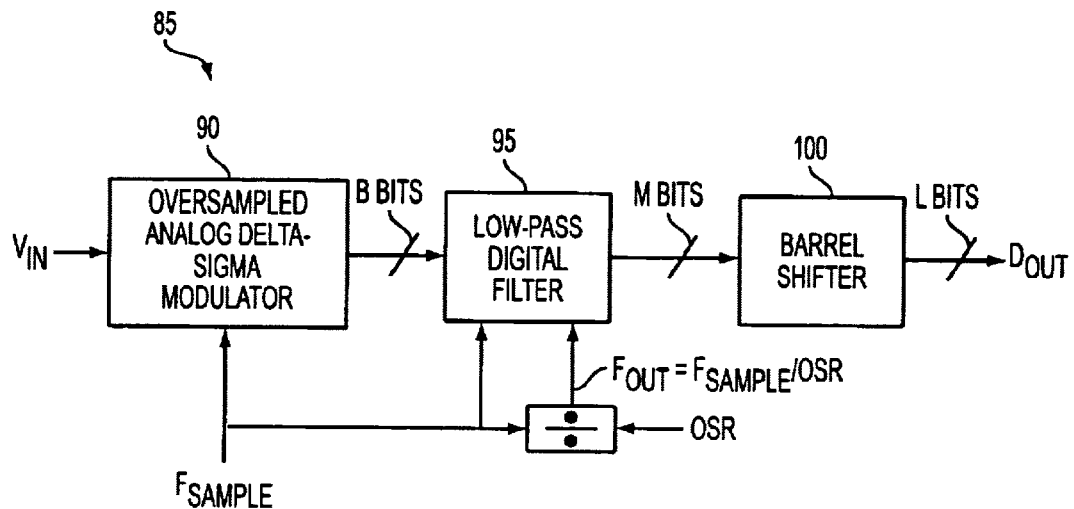
FIG. 5 is a block diagram of a prior art delta-sigma analog-to-digital converter that produces a fullscale output independent of its OSR.

Referring now to FIG. 5, a block diagram of a prior art delta-sigma analog-to-digital converter that produces a fullscale output independent of its OSR is described. ADC 85 consists of analog modulator 90, low-pass digital filter 95, and barrel shifter 100. Low-pass digital filter 95 is a comb filter implemented with a cascade of N integrators and N differentiators as described above.

To produce a fullscale digital output for a given fullscale analog input independent of OSR, the output of digital filter 95 is scaled by barrel shifter 100. Barrel shifter 100 shifts or scales the M-bit output of digital filter 95 to produce an L-bit output. The purpose of barrel shifter 100 is to eliminate the unused top bits of the M-bit output of digital filter 95 when OSR is lower than the maximum allowed OSR that determined the size of digital filter 95. For example, if ADC 80 is designed to handle a maximum OSR of 32,768, for a B=1-bit input and filter order N=4, the M-bit output consists of M=60 bits. If the OSR is reduced to 256, only a portion of the 60-bit digital filter output will be used and the top 28 bits will be zeros. These zeros are discarded by barrel shifter 100 when scaling the 60-bit digital filter output to an L-bit output so that a fullscale digital output is produced for a fullscale analog input independent of OSR. In this case, barrel shifter 100 is a 32:L*J decoder, where J is the number of OSRs allowed by ADC 80. The number of output bits L for ADC 80 is fixed according to M and physical limitations of the hardware implementation, such as noise performance and interference. Preferably, for M<64 bits, L<64 bits. State of the art ADCs set L at a maximum of 24 bits.

Although barrel shifter 100 produces a fullscale digital output for a fullscale analog input, its addition to ADC 80 leads to an increased die area, increased power dissipation, and increased circuit complexity because digital filter 95 still generates unused bits in its M-bit output and these bits may not be discarded by reducing the size of digital filter 95 in ADC 80. As the OSR is reduced, the lower bits in the differentiators are used and the fullscale magnitude is shifted downward. Therefore, the size of digital filter 95 cannot be reduced because the lower bits of the M-bit digital output are needed for smaller values of OSR.

Figure 6:
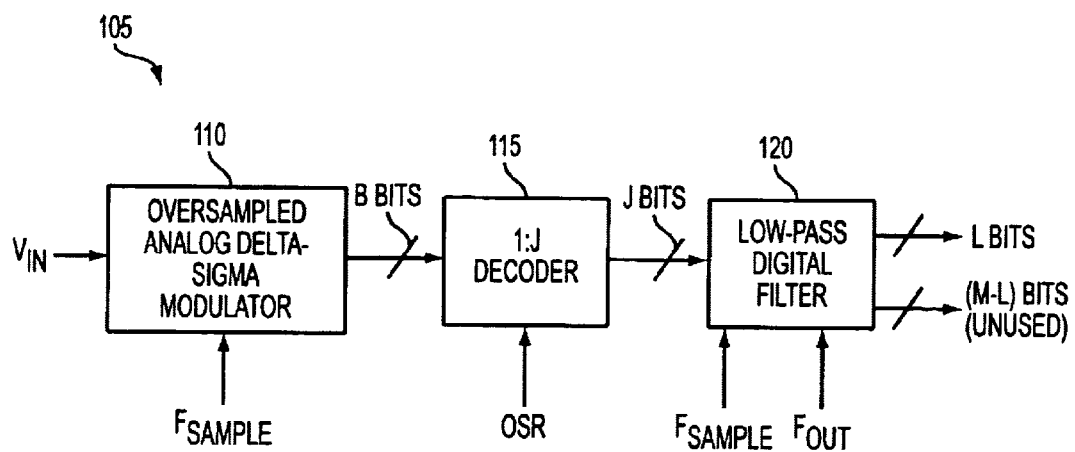
FIG. 6 is a block diagram of a delta-sigma analog-to-digital converter that produces a fullscale output independent of its OSR in accordance with the principles of the present invention.

Referring now to FIG. 6, a block diagram of a delta-sigma analog-to-digital converter that produces a fullscale output independent of its OSR in accordance with the principles of the present invention is described. ADC 105 produces a fullscale digital output for a fullscale analog input with a reduced die area, circuit complexity, and power dissipation as compared to prior art ADC 80 and other ADCs designed to produce a constant fullscale digital output. ADC 105 reduces the die area by reducing the size of digital filter 120 as compared to digital filter 95 of ADC 80.

The size of digital filter 120 is reduced by adjusting the B-input produced by analog modulator 110 with decoder 115 to generate a modified J-bit input to digital filter 120. Preferably, decoder 115 is implemented as a 1:J decoder, where J is the number of possible OSRs allowed by ADC 105 and B=1. Decoder 115 scales the B-input into digital filter 120 according to the OSR so that the bottom M−L bits of the differentiators of digital filter 120 can be removed without loss of accuracy. For B=1, decoder 115 produces an J-bit output that may have a single bit equal to one in a position according to the OSR.

It should be understood by one skilled in the art that ADC 105 may be implemented with an analog modulator that outputs B>1 bits and that decoder 115 may be a multiplier or any other digital circuit component capable of scaling the input of digital filter 120.

Figure 7:
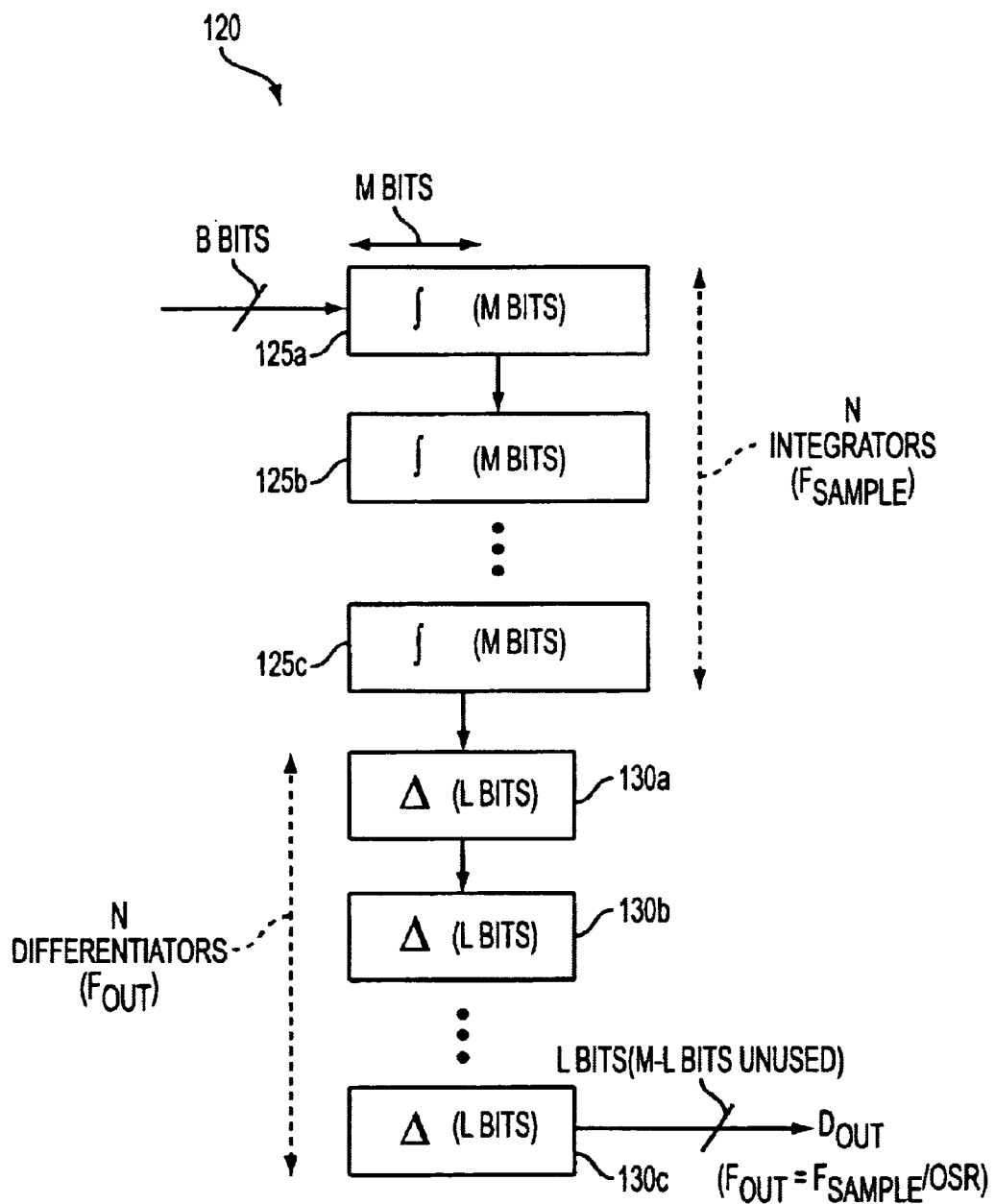
FIG. 7 is a block diagram of the $N^{th}$ order comb filter shown in FIG. 6 built in accordance with the principles of the present invention.

Referring now to FIG. 7, a block diagram of the $N^{th}$ order comb filter shown in FIG. 6 built in accordance with the principles of the present invention is described. Digital filter 120 is implemented as a cascade of N M-bit integrators and N L-bit differentiators to produce a M-bit output having L bits that form the L-bit output of ADC 105, and M−L bits that are left unused.

In the example above, for B=1, OSR=32,768, M=60, and L=32, the differentiator size is reduced from 60 bits to 60−28=32 bits, thereby reducing the die area and power dissipation of ADC 105 by 23% as compared to ADC 80.

Although particular embodiments of the present invention have been described above in detail, it will be understood that this description is merely for purposes of illustration. Specific features of the invention are shown in some drawings and not in others, for purposes of convenience only, and any feature may be combined with other features in accordance with the invention. Steps of the described processes may be reordered or combined, and other steps may be included. Further variations will be apparent to one skilled in the art in light of this disclosure and such variations are intended to fall within the scope of the appended claims.

What is claimed is:

1. A method for producing a constant fullscale output in a delta-sigma analog-to-digital converter having a variable oversample ratio, the method comprising:

providing an analog delta-sigma modulator to generate a first digital signal from an analog input signal;

scaling the first digital signal according to the variable oversample ratio of the analog-to-digital converter to generate a second digital signal;

using the second digital signal as an input to a digital filter to generate a third digital signal; and generating a digital output for the analog-to-digital converter from a portion of the third digital signal.

2. The method of claim 1, wherein having a variable oversample ratio comprises having a number of integer oversample ratios ranging from a minimum oversample ratio to a maximum oversample ratio.

3. The method of claim 1, wherein to generate a third digital signal comprises to generate a digital signal with a number of bits that is a function of the maximum oversample ratio of the analog-to-digital converter, the order of the digital filter, and the number of bits in the first digital signal.

4. The method of claim 1, wherein the digital filter is a comb filter.

5. The method of claim 4, wherein the comb filter comprises a cascade of integrators and differentiators.

6. The method of claim 5, wherein the number of integrators and differentiators is determined by the order of the digital filter.

7. The method of claim 5, wherein the integrators comprise the same number of bits as the third digital signal.

8. The method of claim 5, wherein the differentiators comprise the same number of bits as the digital output of the analog-to-digital converter.

9. The method of claim 1, wherein scaling the first digital signal according to the variable oversample ratio of the analog-to-digital converter to generate a second digital signal comprises using a decoder.

10. The method of claim 1, wherein scaling the first digital signal according to the variable oversample ratio of the analog-to-digital converter to generate a second digital signal comprises using a multiplier.

11. The method of claim 1, wherein the digital output for the analog-to-digital converter comprises a smaller number of bits than the third digital signal.

12. The method of claim 1, wherein generating a digital output for the analog-to-digital converter comprises generating a fullscale digital output for a fullscale analog input.

13. A delta-sigma analog-to-digital converter circuit having a variable oversample ratio, the circuit comprising:

a delta-sigma analog modulator for generating a first digital signal from an analog input signal;

a digital circuit component for scaling the first digital signal according to the variable oversample ratio of the analog-to-digital converter to generate a second digital signal; and a digital filter for generating a third digital signal from the second digital signal, wherein the third digital signal comprises a digital output for the analog-to-digital converter.

14. The circuit of claim 13, wherein the variable oversample ratio comprises a number of integer oversample ratios ranging from a minimum oversample ratio to a maximum oversample ratio.

15. The circuit of claim 13, wherein the digital circuit component comprises a decoder.

16. The circuit of claim 13, wherein the digital circuit component comprises a multiplier.

17. The circuit of claim 13, wherein the number of bits in the third digital signal is a function of the maximum oversample ratio of the analog-to-digital converter, the order of the digital filter, and the number of bits in the first digital signal.

18. The circuit of claim 13, wherein the digital filter is a comb filter.

19. The circuit of claim 18, wherein the comb filter comprises a cascade of integrators and differentiators.

20. The circuit of claim 19, wherein the number of integrators and differentiators is determined by the order of the digital filter.

21. The circuit of claim 19, wherein the integrators comprise the same number of bits as the third digital signal.

22. The circuit of claim 19, wherein the differentiators comprise the same number of bits as the digital output of the analog-to-digital converter.

23. The circuit of claim 13, wherein the digital output of the analog-to-digital converter comprises a smaller number of bits than the third digital signal.

24. The circuit of claim 13, wherein the digital output comprises a fullscale digital output for a fullscale analog input.

25. A method for reducing the die area, circuit complexity, and power dissipation in a delta-sigma analog-to-digital converter having a-variable oversample ratio, the method comprising:

means for generating a first digital signal from an analog input;

means for scaling the first digital signal according to the variable oversample ratio of the analog-to-digital converter to produce a second digital signal; and means for low-pass filtering the second digital signal to produce a third digital signal, wherein the third digital signal comprises a digital output for the analog-to-digital converter.

26. The method of claim 25, wherein the variable oversample ratio comprises a number of integer oversample ratios ranging from a minimum oversample ratio to a maximum oversample ratio.

27. The method of claim 25, wherein the means for generating a first digital signal from an analog input comprises a delta-sigma analog modulator.

28. The method of claim 25, wherein the means for scaling the first digital signal according to the variable oversample ratio of the analog-to-digital converter to produce a second digital signal comprises a decoder.

29. The method of claim 25, wherein the means for scaling the first digital signal according to the variable oversample ratio of the analog-to-digital converter to produce a second digital signal comprises a multiplier.

30. The method of claim 25, wherein the means for low-pass filtering the second digital signal to produce a third digital signal comprises a comb filter.

31. The method of claim 30, wherein the comb filter comprises a cascade of integrators and differentiators.

32. The method of claim 25, wherein the number of bits in the third digital signal is a function of the maximum oversample ratio of the analog-to-digital converter, the order of the digital filter, and the number of bits in the first digital signal.

33. The method of claim 32, wherein the number of integrators and differentiators is determined by the order of the digital filter.

34. The method of claim 31, wherein the integrators comprise the same number of bits as the third digital signal.

35. The method of claim 31, wherein the differentiators comprise the same number of bits as the digital output of the analog-to-digital converter.

36. The method of claim 25, wherein the digital output of the analog-to-digital converter comprises a smaller number of bits than the third digital signal.

37. The method of claim 25, wherein the digital output comprises a fullscale digital output for a fullscale analog input.

\* \* \* \* \*

UNITED STATES PATENT AND TRADEMARK OFFICE
CERTIFICATE OF CORRECTION

PATENT NO. : 6,639,526 B1
DATED : October 28, 2003
INVENTOR(S) : Mayes

It is certified that error appears in the above-identified patent and that said Letters Patent is hereby corrected as shown below:

Column 1,
Line 40, at the end of the line after "of" insert -- Dout. --
Line 44, replace "1:2N." with -- $1:2^N$. --

Column 4,
Line 12, change "$1:2^j$" to -- $1:2^J$ --
Line 56, change "used-to" -- used to --

Column 9,
Line 34, change "a-variable" to -- a variable --

Signed and Sealed this

Twenty-first Day of June, 2005

JON W. DUDAS
*Director of the United States Patent and Trademark Office*